(12) United States Patent
Krueger et al.

(10) Patent No.: US 7,288,605 B2
(45) Date of Patent: Oct. 30, 2007

(54) POLYMER DYE AND METHOD FOR PRODUCING THE SAME AND ITS USE IN LIGHT-EMITTING DIODES AND OTHER OPTICAL COMPONENTS

(75) Inventors: Hartmut Krueger, Potsdam (DE); Bert Fischer, Ahrensdorf (DE); Silvia Janietz, Stahnsdorf (DE); Armin Wedel, Teltow (DE); Juergen Wahl, Bad Soden (DE)

(73) Assignee: Fraunhofer-Gesellschaft zur Foerderung der Angewandten Forschung E.V., Munich (DE)

( * ) Notice: Subject to any disclaimer, the term of this patent is extended or adjusted under 35 U.S.C. 154(b) by 389 days.

(21) Appl. No.: 10/488,021

(22) PCT Filed: Jul. 11, 2002

(86) PCT No.: PCT/EP02/07721

§ 371 (c)(1),
(2), (4) Date: Jul. 15, 2004

(87) PCT Pub. No.: WO03/018711

PCT Pub. Date: Mar. 6, 2003

(65) Prior Publication Data

US 2004/0256981 A1 Dec. 23, 2004

(30) Foreign Application Priority Data

Aug. 27, 2001 (DE) ................. 101 41 866

(51) Int. Cl.
*C08G 63/91* (2006.01)
*C08G 69/48* (2006.01)
*H01J 67/62* (2006.01)
*H01J 63/04* (2006.01)

(52) U.S. Cl. ............... 525/459; 525/418; 525/419; 528/422; 313/504; 257/E51.033; 257/E51.047

(58) Field of Classification Search ............ 528/422; 525/459, 418, 419; 313/504; 257/E51.033, 257/E51.047
See application file for complete search history.

(56) References Cited

U.S. PATENT DOCUMENTS 4,886,744 A  12/1989  Arnost et al.

(Continued)

FOREIGN PATENT DOCUMENTS

AT  E50065 B  5/1987

(Continued)

OTHER PUBLICATIONS

Yoon, Chong-Bok, et al; "Synthesis and second-harmonic generation study of DCM-containing polyurethane"; Synthetic Meatls 117 (2001); Feb. 15, 2001; Elseiver Science B.V.; pp. 233-235; XP-002218695.

(Continued)

*Primary Examiner*—Duc Truong
(74) *Attorney, Agent, or Firm*—Marshall & Melhorn LLC

(57) ABSTRACT

A method and apparatus for the removal of free, emulsified, or dissolved water from liquids of low volatility, such as oil, is shown. The liquid of low volatility is removed by contacting the fluid stream of concern with one side of a semi-permeable membrane. The membrane divides a separation chamber into a feed side into which the stream of fluid is fed, and a permeate side from which the water is removed. The permeate side of the chamber is maintained at a low partial pressure of water through presence of vacuum, or by use of a sweep gas.

9 Claims, 4 Drawing Sheets

U.S. PATENT DOCUMENTS

| | | |
|---|---|---|
| 5,409,783 A | 4/1995 | Tang et al. |
| 5,908,581 A | 6/1999 | Chen et al. |
| 5,935,720 A | 8/1999 | Chen et al. |
| 6,048,630 A | 4/2000 | Burrows et al. |
| 6,051,722 A | 4/2000 | Honda et al. |
| 6,458,909 B1 | 10/2002 | Spreitzer et al. |

FOREIGN PATENT DOCUMENTS

| | | |
|---|---|---|
| DE | 196 52 261 A1 | 6/1998 |
| EP | 0 220 284 B | 5/1987 |
| JP | 08 020614 A | 1/1996 |

OTHER PUBLICATIONS

Harada, Kenji, et al; "High-speed light modulation using complex refractive-index changes of electro-optic polymers"; Applied Physics Letters, vol. 77, No. 23; pp. 3683-3685; Dec. 4, 2000 American Institute of Physics.

POLYMER DYE AND METHOD FOR PRODUCING THE SAME AND ITS USE IN LIGHT-EMITTING DIODES AND OTHER OPTICAL COMPONENTS

BACKGROUND OF THE INVENTION

This invention relates to dicyanomethylene (DCM) based polymer dies and their production. These polymer dyes are used as red-emitting layers in organic optical components, in particular in light-emitting diodes.

Organic luminescence displays and diodes can be produced on the basis of low-molecular weight compounds which are transformed into light-emitting layers by technically relatively complex evaporation coating processes. As a rule it is possible to set the wavelength of the light emitted by dosing the light-emitting layers with certain fluorescence dyes. For example, U.S. Pat. No. 6,048,630 describes saturated red emitting OLEDs that are obtained by dosing $Alq_3$ with special porphine derivatives. For these materials, a strong emission is found at approximately 650 nm. U.S. Pat. No. 5,409,783 teaches magnesium phthalocyanine for dosing of $Alq_3$ for red-emitting luminescence displays. A strong emission is found at 692 nm.

The electroluminescence device has the following structure:
1. Transparent anode made of ITO coated glass
2. Hole injection layer of Cu phthalocyanine (100 Å)
3. Hole transport layer of poly-n-vinyl carbazole (600 Å)
4. Emission layer of $Alq_3$ dosed with magnesium phthalocyanine
5. Electron transport layer of $Alq_3$
6. Cathode of Mg/ag (2000 Å).

The complete device structure is created by deposition processes. U.S. Pat. No. 5,908,581 describes the use of special laser dyes having the general structure

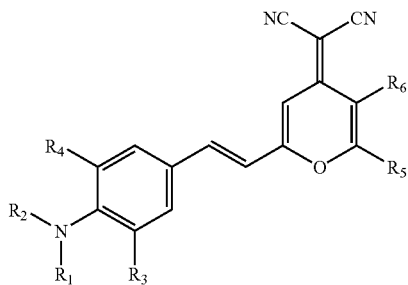

for the dosing of the $Alq_3$ emission layer. The emission maximum is at 616 nm. In addition to the complex technology of the construction of the device, the stability of such dosed emission layers must be viewed critically. As a result of migration processes of the dosing agent or aggregation, there can be a shift of the emission spectrum. Therefore organic LEDs based on conjugated polymers have several advantages. On one hand, these polymers, with suitable structural variations, can be deposited from solution directly in the form of thin films by spin-coating or dip-coating. On the other hand, the active structure is essentially immobilized with regard to migration and aggregation by the bond to a polymer main chain.

Therefore, light-emitting LEDs with different emission wavelengths have been developed. In addition to blue and green shades, it became possible using alkoxy-substituted PPV derivatives (MEH-PPV) to realize wavelengths of 615 nm (DE 196 52 261). Wavelengths>650 nm have not up to now been achieved by conjugated polymers.

Given these disadvantages of the prior art, the object of the invention is to make available polymer dyes, the emission maximum of which is in the red area of the spectrum. These materials must also be easy to process.

SUMMARY OF THE INVENTION

This object is accomplished by a polymer dye on the basis of dicyanomethylene (DCM) having the general formula I

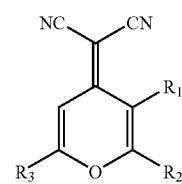

wherein $R_1$=H, straight-chain, branched or cyclic alkyl or alkoxy group with 1-20 C atoms, whereby $R_1$ can be bridged with $R_2$ by a ring of carbon atoms, $R_2$, $R_3$=independently of each other, H, straight-chain, branched or cyclic alkyl or alkoxy group having 1-20 C atoms or aryl, whereby at least one of the two groups is a group having the general formula II

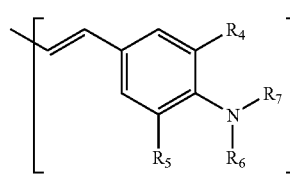

wherein $R_1$, $R_5$=independently of each other, H, straight-chain, branched or cyclic alkyl or alkoxy group with 1-20 C atoms, $R_6$, $R_7$=selected independently of each other, H, straight=chain, branched or cyclic alkyl or alkoxy group having 1-20 C atoms, aryl, carbocyclic or heterocyclic group, whereby $R_4$ can be bridged with $R_7$ and/or $R_5$ with $R_6$ by a ring of carbon atoms, and at least one of the groups $R_6$ and $R_7$ represents a polymer backbone.

DESCRIPTION OF THE PREFFERED EMBODIMENTS

The invention teaches that a polymer dye is prepared on the basis of dicyanomethylene (DCM) having the general formula 1.

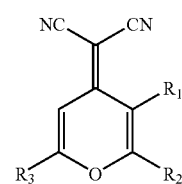

In this case, $R_1$ is selected from the groups hydrogen, straight-chain, branched or cyclic alkyl or alkoxy groups having 1-20 C atoms, whereby $R_1$ can be bridged with $R_2$ by a ring of carbon atoms.

$R_2$ and $R_2$ are selected independently of each other from the groups hydrogen, straight-chain, branched or cyclic alkyl or alkoxy groups having 1-20 C atoms or aryl, whereby at least one of the two groups represents a group having the general Formula II

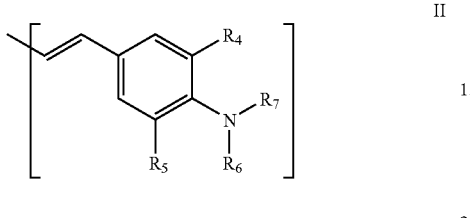

In this case, $R_4$ and $R_5$ are selected independently of each other from the group hydrogen, straight-chain, branched or cyclic alkyl or alkoxy groups having 1-20 C atoms and $R_6$ and $R_7$ are selected independently of each other from the group hydrogen, straight-chain, branched or cyclic alkyl or alkoxy groups having 1-20 C atoms, aryl, carbocyclic or heterocyclic groups. In this case, $R_4$ can be connected with $R_7$ and/or $R_5$ with $R_6$ by means of a ring of carbon atoms. At least one of the groups $R_6$ and $R_7$ must represent a polymer backbone, e.g. a polyester, a polyamide, a polyurea or a polyurethane.

The polymer dye preferably has an emission maximum between 620 and 680 nm, with particular preference given to a maximum that lies between 640 and 660 nm, i.e. in the saturated red area of the spectrum.

The at least one polymer group $R_6$ or $R_7$ is preferably bonded to the dye by means of a hydroxyalkyl or aminoalkyl group. Particular preference is given to the use of a hydroxyethyl group.

The polymer dye preferably has a symmetrical structure. In that case, the groups $R_2$ and $R_3$ represent identical groups having the formula II.

Alternatively, however, it is also possible that one of the groups $R_2$ or $R_3$ is a group that is different from the one illustrated in Formula II, e.g. an alkyl group. In that case, the molecule in question is asymmetrical.

Preferably the two groups $R_6$ and $R_7$ represent identical polymer groups, e.g. polyester groups.

Alternatively, however, it is also possible that one of the groups $R_6$ or $R_7$ is a nonpolymer-forming group, e.g. an alkyl group.

The invention also teaches a method that has been developed for the manufacture of polymer dyes on the basis of dicyanomethylene (DCM), beginning with a malononitrile having the general Formula III

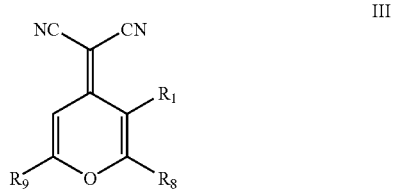

$R_1$ is thereby selected from the group hydrogen, straight-chain, branched or cyclic alkyl or alkoxy groups having 1-20 C atoms. $R_8$ and $R_9$ are selected independently of each other from the group hydrogen, straight-chain, branched or cyclic alkyl or alkoxy groups having 1-20 C atoms, aryl, whereby $R_1$ can be bridged with $R_8$ by a ring of carbon atoms, and at least one of the groups $R_8$ and $R_9$ is a methyl group.

The method thereby proceeds according to the steps described below:

a) First, a condensation reaction with an amino benzaldehyde having the general Formula IV is conducted.

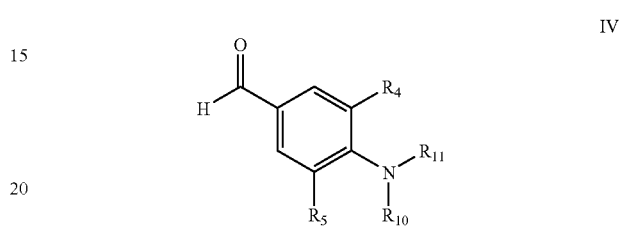

In this case, $R_4$ and $R_5$ are selected independently from one another from the group hydrogen, aryl, straight-chain, branched or cyclical alkyl or alkoxy groups having 1-20 C atoms. $R_{10}$ and $R_{11}$ are selected independently from the group hydrogen, straight-chain, branched or cyclic alkyl or alkoxy groups having 1-20 C atoms, acyl, carbocyclic or heterocyclic groups, whereby $R_4$ can be bridged with $R_{11}$ or $R_5$ with $R_{10}$ by a ring of carbon atoms, and at least one of the groups $R_{10}$ and $R_{11}$ represents an amino or hydroxyalkyl group.

This condensation reaction results in a compound having the general formula V

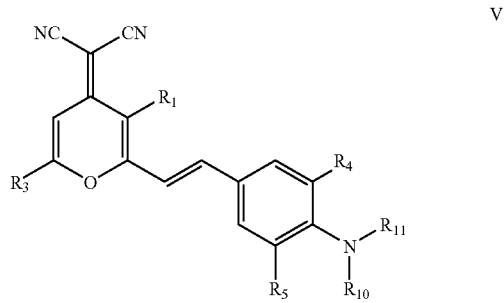

b) Then the compound having the general formula V is reacted with a comonomer, e.g. a dicarboxylic acid, a dicarboxylic acid chloride, a dicarboxylic acid anhydride or a diisocyanate and forms a polymer having the general Formula I.

Preference is given to the use of a malononitrile having the general Formula III, in which $R_8$ and $R_9$ represent methyl groups. On the basis of the approximately identical reactivity of the methyl groups in the 2 and 6 position of the pyran ring, in addition to the formation of monocondensates, there is also an increased formation of bifunctional condensates.

Preferably, the bifunctional condensation products are thereby separated chromatographically from the monofunctional condensation products.

It is also possible, however, to target the production of bifunctional condensates, because with a corresponding functionality they also represent suitable polymer dyes for saturated red emitting polymer materials. As a result of the elongation of the conjugation length compared to the mono-condensates, there is a significant red shift of the absorption maximum.

Preferably, after the synthesis, the polymer dye is dissolved in a suitable solvent and processed into thin films. The solvent used is preferably chloroform or cyclohexanone.

In an additional advantageous development of the method, in Step b), an additional dihydroxide and/or diamino compound can be added to or at least partly substituted in the compound having the Formula V. Particular preference is thereby given to the use of a compound having the general Formula VI

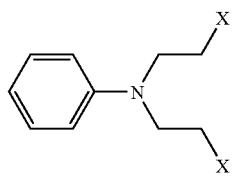

VI with X=OH or NH$_2$. The dye concentration in the resulting polymer can now be varied by means of these non-chromophoric dihydroxy or diamino compounds. This may prevent the fluorescence extinction that may occur at high dye concentrations and improve the solubility of the copolymers as a result of the comonomer.

In this manner, the DCM dye content can preferably be set in the concentration range between 0.5 and 100 mole per cent, and particularly preferably between 5 and 40 mole per cent.

The object of the invention is explained in greater detail below with reference to the exemplary embodiments that are illustrated in the accompanying diagrams, although the invention is in no way restricted to the examples described or illustrated.

FIG. 1 shows the current-voltage characteristic of the polymer dye from Example 7. The current (in Amperes) is thereby plotted against the voltage (in Volts). This spectrum was recorded by bonding the electrodes (ITO and silver) and by then applying a negative potential too the aluminum electrode. A significant increase in the current was thereby observed beginning at a voltage of approximately 15 V.

Figure 4:
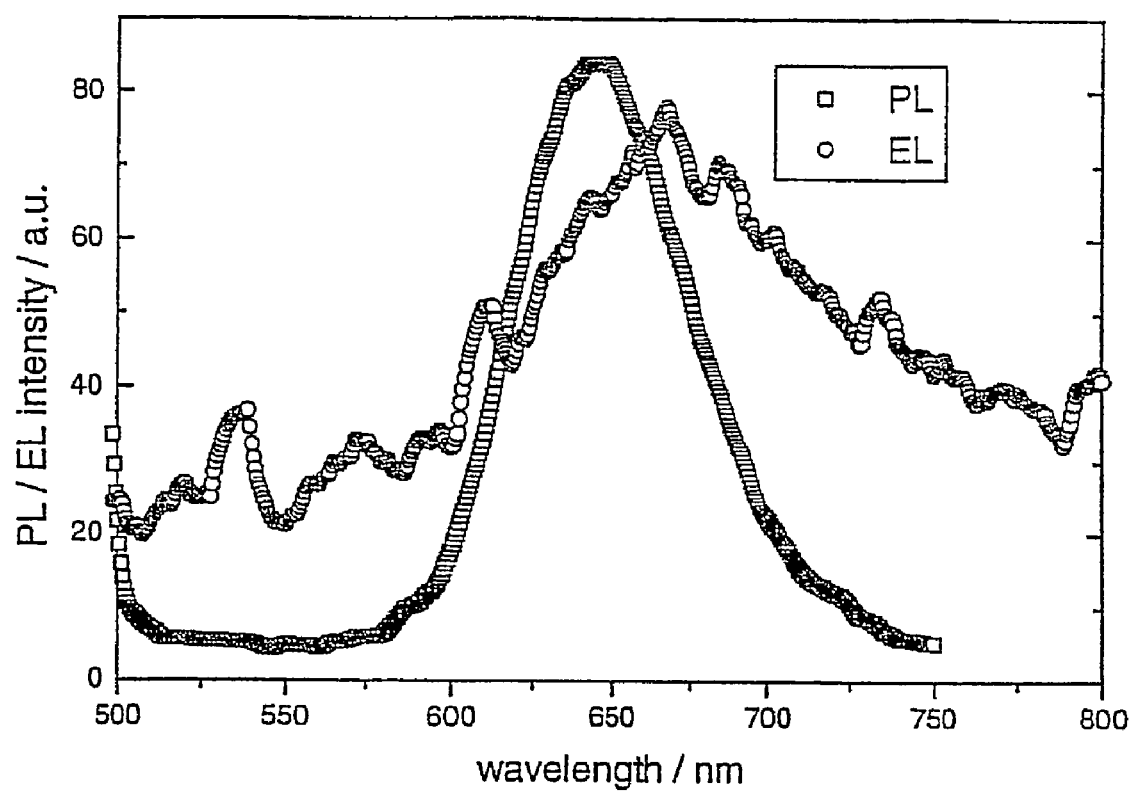

FIG. 4 shows the emission spectrum of the device with the polymer dye from Example 7. With regard to photoluminescence, the spectrum thereby has a maximum at 645 nm, and a maximum for the electroluminescence at 660 nm. This figure shows clearly that a red polymer emitter material has been produced that can be used in OLEDs.

Functionalized DCM-dyes

EXAMPLE 1

Manufacture of 4-(dicyanomethylene)-2-methyl-6-(4-(bis-(2-acetyloxy)-ethyl)-aminostyryl)-4H-pyran

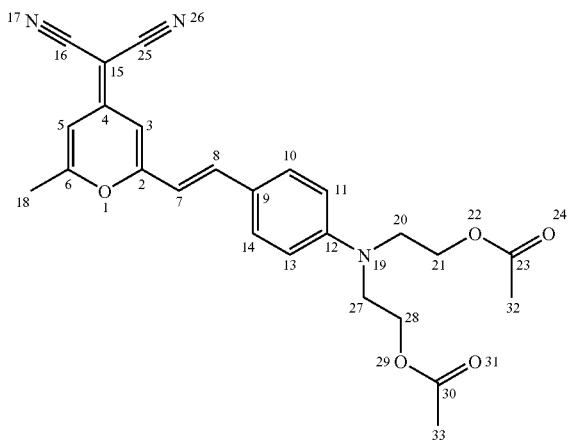

0.88 g of (2,6-dimethyl-4H-pyran-4-ylidene)-malononitrile and 1.47 g of 4-[bis-[2(acetyloxy)ethyl-amino] benzaldehyde are reflux-boiled in 75 ml of toluene with the addition of 20 drops of piperidine for 18 hours under N$_2$. The solution is concentrated in the rotary film evaporator. The residue is dissolved in 20 ml of acetone and precipitated in 200 ml of water. The educts and other highly volatile impurities are removed from the raw product, which has been drawn off and dried, by sublimation at $2*10^{-3}$ mbar and 90° C. The other impurities (essentially the bis condensate) are removed by flash chromatography (silica gel, ethyl acetate/hexane 1:1). 0.7 g (22%) of pure product is obtained.

Elementary Analysis:

| Element | Contents (theoretical) | Contents (measured) |
|---|---|---|
| N | 9.39 | 9.42 |
| C | 67.10 | 66.95 |
| H | 5.63 | 5.55 |

Result $^{13}$C-NMR in acetone-d$_6$:

d in ppm: 171.730 (C23 and C30); 164.775 (C6); 162.515 (C 12); 158.168 (C4); 151.133 (C8); 131.436 (C10 and C14); 124.855 (C9); 116.744 (C17 and C26); 114.879 (C7); 113.604 (Cl 1 and Cl 3); 196.976 (C5); 106.670 (C3); 62.514 (C21 and C28); 57.602 (Cl 5); 50.838 (C20 and C27); 21.421 (C31 and C32); 20.401 (C18)

EXAMPLE 2

Manufacture of 4-(dicyanomethylene)-2-methyl-6-(4-bis-(2-hydroxyethyl)-aminostyryl)-4H-pyran 0.57 g of 4-(dicyanomethylene)-2-methyl-6-(4-(bis-(2-acetyoxy)-ethyl)-aminostyryl)-4H-pyran, to which 2.5 ml of 5% NaOH is added, is stirred in 25 ml of methanol for 2.5 hours at 40° C. under nitrogen. After cooling, the precipitate obtained is filtered, washed with methanol and dried. 0.33 g of product (72%) is obtained.

| Element | Contents (theoretical) | Contents (measured) |
|---|---|---|
| N | 11.56 | 11.16 |
| C | 69.41 | 69.25 |
| H | 5.82 | 5.89 |

EXAMPLE 3

Manufacture of 4-(dicyanomethylene)-2,6-bis-(4-(N-2-hydroxyethyl-N-methyl)-aminostyryl-4H-pyran

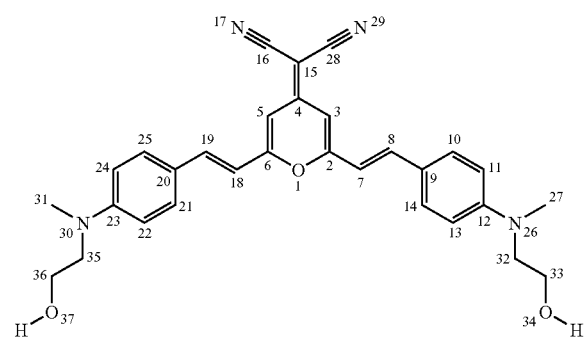

2 g of (2,6 2,6-dimethyl-4H-pyran-4-ylide)-malononitrile and 4.37 g of N-methyl-N-(2-hydroxyethyl)-4-aminobenzaldehyde were placed in 30 ml of n-butanol. After the addition of approximately 1 ml of piperidine, the solution was reflux boiled for 12 hours. After cooling, the precipitate was drawn off and washed twice with a small amount of methanol. The raw product was decocted with 50 ml of methanol, cooled, drawn off and dried. 4.56 g of chromatographically pure 4-(dicyanomethylene)-2,6-bis-(4-(N-2-hydroxyethyl-N-methyl)-aminostyryl-4H-pyran (yield 79%) was obtained.

Result of the Elememtary Analysis:

| Element | Contents (theoretical) | Contents (measured) |
|---|---|---|
| N | 11.33 | 11.37 |
| C | 72.85 | 72.17 |
| H | 6.11 | 6.47 |

Result $^{13}$C-NMR in DMSO-$d_6$:

d in ppm: (160 (C4); 156 (C2 and C6); 151 (C12 and C23); 139 (C8 and C19); 130 (C7 and C18); 122 (C10, C14, C21 and C25); 116 (C9 and C20); 113 (C6 and C28); 111 (C11, C13, C22 and C24); 105 (C3 and C5); 58 (C33 and C36); 54 (C32 and C35); 53 (C15)?; 39 (C27 and C31); 31 (solvent ?)

Polymer Syntheses with DCM Dyes

EXAMPLE 4

Polyester Synthesis from the Dye in Example 3 and isophthalic acid dichloride 0.495 g of 4-(dicyanomethylene)-2,6-bis-(4-(N-2-hydroxyethyl-N-methyl)-aminostyryl-4H-pyran were dissolved in 10 ml DMF+5 ml pyridine. 0.2039 g of isophthalic acid dichloride in solution form was added a drop at a time to 5 ml DMF while stirring. After 4 hours at room temperature, the polyester was precipitated in 650 ml methanol. The precipitate was drawn off, washed several times with methanol and dried in a vacuum. The result was 460 mg of polyester (74% yield). For further purification, the polymer was dissolved in 50 ml DMAc, the insoluble components were filtered out, precipitated in 500 ml methanol, drawn off, washed with methanol and dried in a vacuum.

Result of Elementary Analysis:

| Element | Contents (theoretical) | Contents (measured) |
|---|---|---|
| N | 8.97 | 8.89 |
| C | 73.06 | 69.43 |
| H | 5.16 | 5.50 |

Result $^{13}$C-NMR in DMSO-$d_6$:

d in ppm: 167 (cannot be classified); 166 (C33 and C44); 161 (C4); 157 (C2 and C6); 152, C12 and C22); 139 (C8 and C 18); 134.5 (C41 and C43); 131 (C39); 130.5 (C7, C18 and C42); 130 (C38 Lind C40); 124 (C 10, C14, C20 and C24); 117 (C9 and C 19); 114 (C 16 and C27); 112 (C 11, C 13, C21 and C23); 106 (C3 and C5); 63 (C31 and C36); 59.5 (C in the neighborhood of free OH-groups?); 55 (C30 and C35); 51 (C 15); 39 (C26 and C29)1

EXAMPLE 5

Polyester from the Dye Described in Example 3 and 2.5-di-(2-ethylhexyloxy)-terephthalic acid dichloride:

0.4946 g 4-(dicyanomethylene)-2,6-bis-(4-(N-2-hydroxyethyl-N-methyl)-aminostyryl)-4H-pyran were dissolved in 10 ml DMF and the 2,5-di-(2-ethylhexyloxy)-terephthalic acid dichloride (0.4594 g) was added a drop at a time at room temperature to 5 ml DMF+5 ml pyridine with agitation. After 2.5 hours, the polymer was precipitated in 500 ml methanol. The polymer was drawn off, washed with methanol and dried in a vacuum. The yield was 560 mg (64%). For purification, the polymer was dissolved in 30 ml of chloroform and precipitated in 300 ml of methanol. It was drawn off and again dissolved in 30 ml of chloroform and precipitated in 300 ml of hexane. The purified product was dried in a vacuum.

Result of Elementary Analysis:

| Element | Contents (theoretical) | Contents (measured) |
|---|---|---|
| N | 6.36 | 6.45 |
| C | 73.61 | 70.78 |
| H | 7.32 | 7.04 |

Result $^{13}$C-NMR in CDCl$_3$:

d in ppm: 166 (C33 and C51); 159 (C4); 156 (C2 and C6); 152 (C12 and C22); 150 (C39 and C42); 138 (C9 and C18); 130 (C7 and C17); 124 (C38 and C41); 123 (Cl 0, C14, C20 and C24); 116,5 (C9 and C19); 116 (C40 and C43); 114 (C16 and C27); 112 (Cl 1, C13, C21, and C23); 105 (C3 and C5); 72 (C45 and C54); 62 (C31 and C36); 54 (Cl 5); 50 (C30 and C35); 39.5 (C46 and C55); 39 (C26 and C29); 30 (C47 and C56); 29 (C48 and C57); 24 (C50 and C62); 23 (C49 and C58)i 14 (C50 and C59); 11 (C61 and C63).

EXAMPLE 6

Polyurethane from the Dye Described in Example 3 and 4,4'-methylene-bis-(phenyl isocyanate) (MDI)

0.4946 g of 4-(dicyanomethylene-2,6-bis-(4-(N-2-hydroxyethyl-N-methyl)-aminostyryl)-4H-pyran were added in the form of a solution in 20 ml DMF under an $N_2$ atmosphere to a solution of 0.2503 g MDI in 5 ml DMF. First the solution was stirred at room temperature for 3.5 h. Then the temperature was increased to 70° C. and stirred for an additional 2 hours. The solution was precipitated in 300 ml methanol+100 ml hexane. Then it was drawn off, washed with methanol and dried in a vacuum. The yield was 0.71 g (74%). For further purification, the polyurethane was dissolved in 30 ml DMF and again precipitated in 300 ml methanol+100 ml hexane.

Result of Elementary Analysis:

| Element | Contents (theoretical) | Contents (measured) |
|---------|------------------------|---------------------|
| N | 11.28 | 12.35 |
| C | 72.56 | 66.34 |
| H | 5.41 | 6.14 |

Result $^{13}$C-NMR (DMF-d7):

161 (C4); 157 (C2 and C6); 154.5 (C33 and C53); 151 (C12 and C22); 139 (CS and Cl 8); 138 (C42 and C46); 137 (C39 and C49); 131 (C7 and Ci 7); 130 (C41, C43, C47 and C51); 124 (C10, C14, C20 and C-24); 119 (C40, C44, C48 and C50); 117 (C9 and Cl 9); 114 (Cl 6 and C27); 112.5 (Cl 1, Cl 3, C21 and C23); 105.5 (C3 and C5); 62.5 (C31 and C36); 55 (Cl 5); 51.5 (C30 and C35); 41 (C45); 39 (C26 and C29).

EXAMPLE 7

Co-polyurethane from the Dye Described in Example 3, 4-4'-methylene-bis-(phenylisocyanate) and N-phenyl-diethanolamine:

0.4946 g of 4-(dicyanomethylene-2,6-bis-(4-(N-2-hydroxyethyl-N-methyl)-aminostyryl)-4H-pyran (1 mmol) and 0.7249 g of (4 mmol) N-phenyl diethanoldiamine were dissolved under an Ar atmosphere in 60 ml of DMAc. After the addition of 1.2513 g (5 mmol), 4,4'-methylene-bis-(phenylisocyanate), the solution was heated to 80° C. and stirred at this temperature for 5 hours. The polymer was precipitated in a mixture of 600 ml methanol and 200 ml hexane. The precipitate was dried in a vacuum. For further purification, it was dissolved in THF, precipitated in 200 ml hexane, drawn off and dried in a vacuum. 1.09 g (44%) of the copolymer were obtained.

Result of the Elementary Analysis

| Element | Contents (theoretical) | Contents (measured) |
|---------|------------------------|---------------------|
| N | 10.05 | 10.13 |
| C | 70.18 | 69.25 |
| H | 5.75 | 6.33 |

Result $^{13}$C-NMR (DMF-d7):

All the signals of the monomers are present. The signal of the urethane hydrocarbon at 154.5 ppm was also found. From the ratio of the signals of the monomers, a molar copolymer composition of MDI=1, N-phenyl diethanoldiamine=0.64 and DCM-A-derivative=0.36 was calculated.

EXAMPLE 8

Co-polyester from the Dye as Described in Example 3, 2,5-di-(2-ethylhexyloxy)-terephthalic acid dichloride and N-Phenyl diethanol amine 0.1978 g of (0.4 mmol) 4-(dicyanomethylene)-2,6-bis-(4-(N-2-hydroxyethyl-N-methyl)-aminostyryl)-4H-pyran and 0.2800 g N-phenyldiethanol amine (1.6 mmol) were added to 20 ml DMAc. The 2,5-di-(2-ethylhexyloxy)-terephthalic acid dichloride (0.9179 g) was added dropwise in the form a solution to 5 ml DMAc while being stirred at room temperature. After 14 hours, the solution was precipitated in 500 ml methanol. It was drawn off and dried at 50° C. in a vacuum. 0.38 g (59%) of the copolyester was obtained.

Result of the Elementary Analysis:

| Element | Contents (theoretical) | Contents (measured) |
|---------|------------------------|---------------------|
| N | 3.25 | 3.30 |
| C | 72.27 | 71.01 |
| H | 8.42 | 8.45 |

Result $^{13}$C-NMR (DMF-d7):

All the signals of the monomers are present. The signal of the ester bond is also found at 165.5 ppm. From the ratio of the signals of the monomers, a molar copolymer composition of 2,5-di-(2-ethylhexyloxy)-terephthalic acid dichloride=1, N-phenyldiethanol diamine=0.81 and DCM derivative as described in Example 3=0.19 was calculated.

Production of the Device

EXAMPLE 9

PLEDs are produced using the general method outlined below. This method must naturally be adapted in the individual case to the respective conditions (e.g. polymer viscosity, optimal layer thickness of the polymer in the device etc.). The PLEDs described below are single-layer systems, i.e. substrate/ITO/polymer/cathode.

From the polymer described in Example 7, a solution was prepared with a concentration of 3-25 mg/ml in THF, DMF and chloroform at room temperature. For the manufacture of the electroluminescence device, the polymer was dissolved in THF and solutions in the concentration range of 0.25% to 1% were prepared. The preferred range is thereby between 0.6% and 0.8%.

From the polymer described in Example 5, a solution was prepared with a concentration of 5-20 mg/ml in THF, DMF and chloroform at room temperature. For the manufacture of the electroluminescence device, the polymer was dissolved in chloroform and solutions in the concentration range of 0.25% to 1% were prepared. The preferred range is thereby between 0.7% and 0.9%.

Depending on the polymer, it may also be advantageous to agitate the solutions for some time at 50-70° C. or to treat them in an ultrasound bath.

Before the spin-coating of the polymer solution on an ITO-coated glass substrate (Balzers) approximately 25 cm², a polymer intermediate layer (BAYTRON®) is deposited for the matching of the injection barriers.

The polymer solution in Example 7 was purified through a 1 μm spray filter prior to the spin-coating. Then the polymer layer was deposited with a thickness of approximately 100 nm. The layer was tempered under inert conditions at 110° C. for 2 hours.

The polymer solution described in Example 5 was purified through a 1 μm spray filter before the spin-coating. Then the polymer layer was deposited with a thickness of approximately 100 nm. The layer was tempered under inert conditions at 110° C. for 2 hours.

The layer thicknesses can be varied by means of the spin-coating parameters between 30-200 nm. Then the cathode consisting of a thin layer of calcium (approximately 30 nm) and a silver layer (approximately 100 nm) was evaporated.

Figure 1:
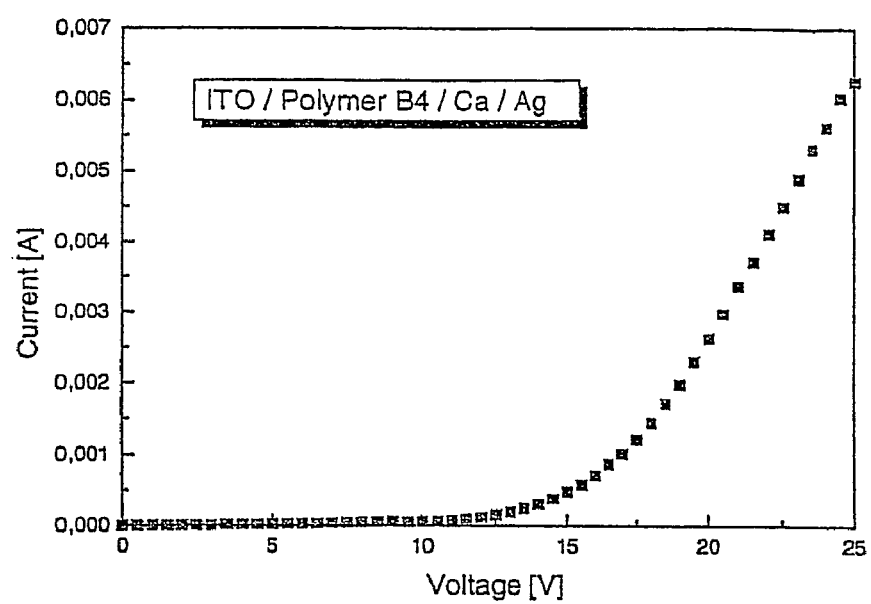
Figure 2:
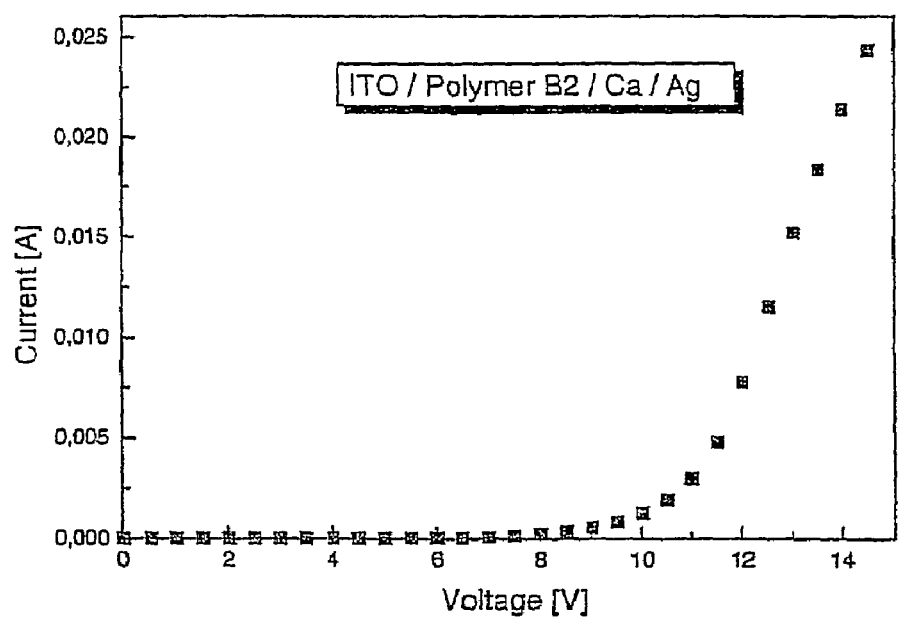
FIG. 2 shows a spectrum recorded analogous to FIG. 1 for the polymer dye from Example 5. This spectrum shows a significant increase of the current beginning at a voltage of approximately 10 V.
Figure 3:
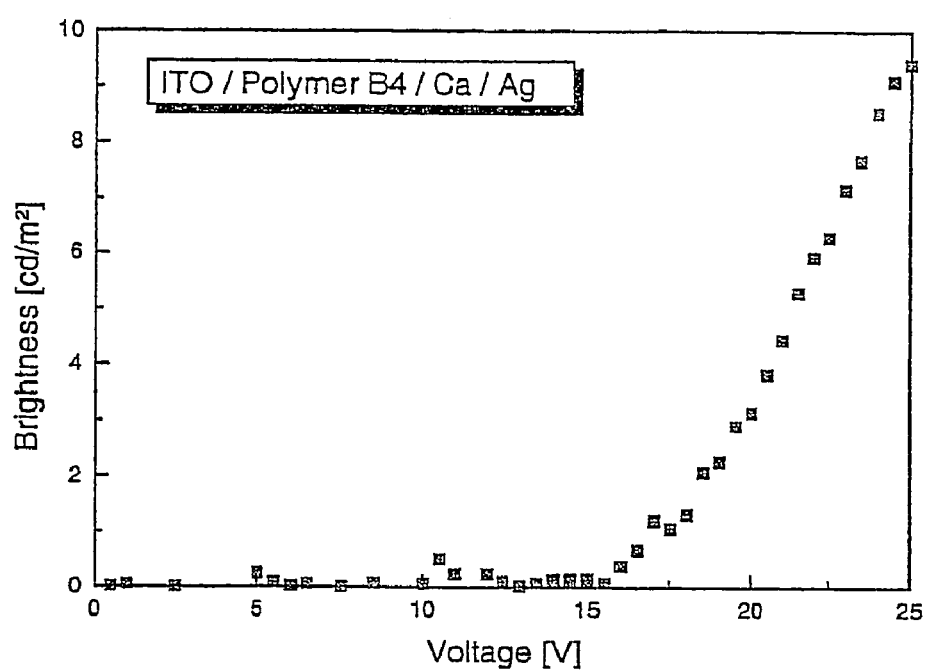
FIG. 3 shows a plot of the luminous flux density of the device with the polymer dye from Example 7 as a function of the voltage. In this case there is a significant increase in the luminous flux density beginning at a voltage of approximately 15 V.

After the electrodes (ITO and silver) had been placed in contact and a negative potential had been applied to the aluminum electrode, the electrical and optical characterizations illustrated in FIGS. 1 to 3 were performed.

What is claimed is:

1. A polymer dye on the basis of dicyanomethylene (DCM) having the general formula I

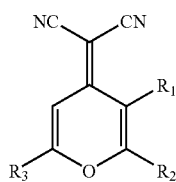

wherein $R_1$=H, straight-chain, branched or cyclic alkyl or alkoxy group with 1-20 C atoms, whereby $R_1$ can be bridged with $R_2$ by a ring of carbon atoms, $R_2$, $R_3$=independently of each other, H, straight-chain, branched or cyclic alkyl or alkoxy group having 1-20 C atoms or aryl, whereby at least one of the two groups is a group having the general formula II

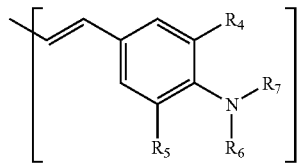

wherein $R_4$, $R_5$=independently of each other, H, straight-chain, branched or cyclic alkyl or alkoxy group with 1-20 C atoms, $R_6$, $R_7$=selected independently of each other, H, straight=chain, branched or cyclic alkyl or alkoxy group having 1-20 C atoms, aryl, carbocyclic or heterocyclic group, whereby $R_4$ can be bridged with $R_7$ and/or $R_5$ with $R_6$ by a ring of carbon atoms, and at least one of the groups $R_6$ and $R_7$ represents a copolymer backbone, producible by copolymerization of a first comonomer selected from the group consisting of: dicarboxylic acids, dicarboxylic acid chlorides, dicarboxylic anhydrides and diisocyanates; and a second comonomer selected from the group consisting of: dihydroxy and diamino compounds.

2. The dye as claimed in claim 1, wherein the emission maximum lies between 620 nm and 680 nm.

3. The dye as claimed in claim 1, wherein at least one of the polymer groups $R_6$ and $R_7$ is bonded to the dye by a hydroxyalkyl or an aminoalkyl group.

4. The dye as claimed in claim 1, wherein at least one of the groups $R_6$ and $R_7$ is an alkyl group.

5. The dye according to claim 1, wherein the polymer backbone is a backbone of one of copolyesters, copolyamides, or copolyurethanes.

6. The dye according to claim 2, wherein the emission maximum lies between 640 and 660 nm.

7. The dye according to claim 3, wherein the hydroxyalkyl or aminoalkyl group bonding at least one of the copolymer groups $R_6$ and $R_7$ is a hydroxyethyl group.

8. The dye according to claim 1, wherein the at least one of the groups $R_2$ and $R_3$ which is an alkyl group is a methyl group.

9. The dye according to claim 4, wherein the at least one of the groups $R_6$ and $R_7$ which is an alkyl group is a methyl group.

* * * * *